(12) United States Patent
Amano et al.

(10) Patent No.: US 6,565,662 B2
(45) Date of Patent: May 20, 2003

(54) VACUUM PROCESSING APPARATUS FOR SEMICONDUCTOR PROCESS

(75) Inventors: Kenji Amano, Nirasaki (JP); Yoshitsugu Tanaka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 130 days.

(21) Appl. No.: 09/739,701

(22) Filed: Dec. 20, 2000

(65) Prior Publication Data

US 2001/0006094 A1 Jul. 5, 2001

(30) Foreign Application Priority Data

Dec. 22, 1999 (JP) ............................................ 11-365011

(51) Int. Cl.[7] ........................ H01L 21/306; C23C 16/00
(52) U.S. Cl. ...................... 118/715; 118/719; 118/728; 156/345.51; 156/345.55; 156/345.32; 156/345.34
(58) Field of Search ................................. 118/715–733; 156/345.1, 345.55, 345.51, 345.32, 345.34

(56) References Cited

U.S. PATENT DOCUMENTS 5,912,555 A  * 6/1999 Akaike et al. ............ 324/158.1
6,035,804 A  * 3/2000 Arami et al. ................ 118/715

FOREIGN PATENT DOCUMENTS

JP            11140648      * 5/1999       ........... C23C/16/44

* cited by examiner

*Primary Examiner*—Gregory Mills
*Assistant Examiner*—Ram N Kackar
(74) *Attorney, Agent, or Firm*—Oblon, Spivak, McClelland, Maier & Neustadt, P.C.

(57) ABSTRACT

A plasma etching apparatus includes a process container formed of a container main body and an upper casing combined with each other. A detaching device is provided to move the upper casing between a mounted position where the upper casing is put on the container main body, and a retreated position where the upper casing is removed from the container main body. The detaching device supports the upper casing to be rotatable, movable up and down, and movable in a lateral direction, relative to the container main body. The retreated position is arranged such that the upper casing does not interfere with the container main body when the upper casing is rotated there.

21 Claims, 7 Drawing Sheets

VACUUM PROCESSING APPARATUS FOR SEMICONDUCTOR PROCESS

CROSS-REFERENCE TO RELATED APPLICATIONS

This application is based upon and claims the benefit of priority from the prior Japanese Patent Application No. 11-365011, filed Dec. 22, 1999, the entire contents of which are incorporated herein by reference.

BACKGROUND OF THE INVENTION

The present invention relates to a vacuum processing apparatus for a semiconductor process, which handles a target substrate such as a glass substrate (LCD substrate) for a liquid crystal display (LCD) or a semiconductor wafer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

A vacuum processing installation of a so-called multi-chamber type is used for performing a semiconductor process on a target substrate, such as a semiconductor wafer or an LCD substrate. This vacuum processing installation includes a plurality of vacuum processing apparatuses each for subjecting a target substrate to an etching, ashing or film-forming process in an atmosphere at a reduced pressure. Generally, the vacuum processing installation includes a transfer chamber with a transfer mechanism for transferring target substrates, and the plurality of vacuum processing apparatuses disposed around the transfer chamber. The transfer mechanism in the transfer chamber is arranged to transfer unprocessed substrates into the respective process chambers of the vacuum processing apparatuses, and to transfer processed substrates out of the process chambers.

The process container for forming the process chamber of each of the vacuum processing apparatuses is arranged to be openable so that the interior of the process chamber can be subjected to maintenance operations. FIG. 8 is a perspective view showing a conventional opening mechanism for a process container. Specifically, an upper casing 102 is rotatably attached to a container main body or lower casing 101 by a hinge 103. A cylinder mechanism 104 is disposed on a side adjacent to the side on which the hinge 103 is attached. When the cylinder mechanism 104 extends/retreats, the upper casing 102 is rotated about the hinge 103 and is open/closed relative to the container main body.

For a process using a gas, such as an etching process, a heavy member, such as a showerhead for spouting the gas, is attached in the upper casing 102. Due to the heavy member, as shown in FIG. 8, the upper casing 102 can be opened only to about 70° where the gravitational center of the upper casing 10 has not moved beyond the rotational axis of the upper casing 102, i.e., the hinge 103. This brings about problems in that maintenance operations performed on the interior of the process container, i.e., both the container main body 101 and the upper casing 102, and attaching/detaching operations of heavy members are not easy. Especially, LCD substrates are required to be larger these days, and thus so are processing apparatuses. This tendency causes the above described maintenance operations for the interior of the process container, and the attaching/detaching operations of heavy members to be more difficult and dangerous.

BRIEF SUMMARY OF THE INVENTION

An object of the present invention is to provide a vacuum processing apparatus for a semiconductor process, which allows maintenance operations for the interior of a process container, and attaching/detaching operations of heavy members to be performed more easily.

According to a first aspect of the present invention, there is provided a vacuum processing apparatus for a semiconductor process, comprising:

a process container forming an airtight process chamber, and comprising a container main body and an upper cover detachably disposed on the container main body;

a supporting member configured to support a target substrate in the process chamber;

a gas supply system configured to supply a process gas into the process chamber;

an exhaust system configured to exhaust the process chamber and set the process chamber at a vacuum; and a detaching device configured to attach/detach the upper cover relative to the container main body, the detaching device comprising a rotational mechanism configured to rotatably support the upper cover, an up-and-down movement mechanism configured to support the rotational mechanism and the upper cover to be movable up and down, and a lateral movement mechanism configured to support the up-and-down movement mechanism, the rotational mechanism, and the upper cover to be movable in a lateral direction.

According to a second aspect of the present invention, there is provided a vacuum processing apparatus for a semiconductor process, comprising:

a process container forming an airtight process chamber, and comprising a lower casing and an upper casing detachably joined to each other at a position on a wall forming the process chamber;

a seal member interposed between the lower casing and the upper casing;

a worktable on which the target substrate is mounted in the process chamber, the worktable being attached to the lower casing;

a gas supply system configured to supply a process gas into the process chamber, and comprising a showerhead including a plurality of gas spouting holes disposed in the process chamber, the showerhead being attached to the upper casing;

an exhaust system configured to exhaust the process chamber and set the process chamber at a vacuum; and a detaching device configured to move the upper casing between a mounted position where the upper casing is put on the lower casing, and a retreated position where the upper casing is removed from the lower casing, the detaching device supporting the upper casing to be rotatable, movable up and down, and movable in a lateral direction, relative to the lower casing, such that the upper casing does not interfere with the lower casing when the upper casing is rotated at the retreated position.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
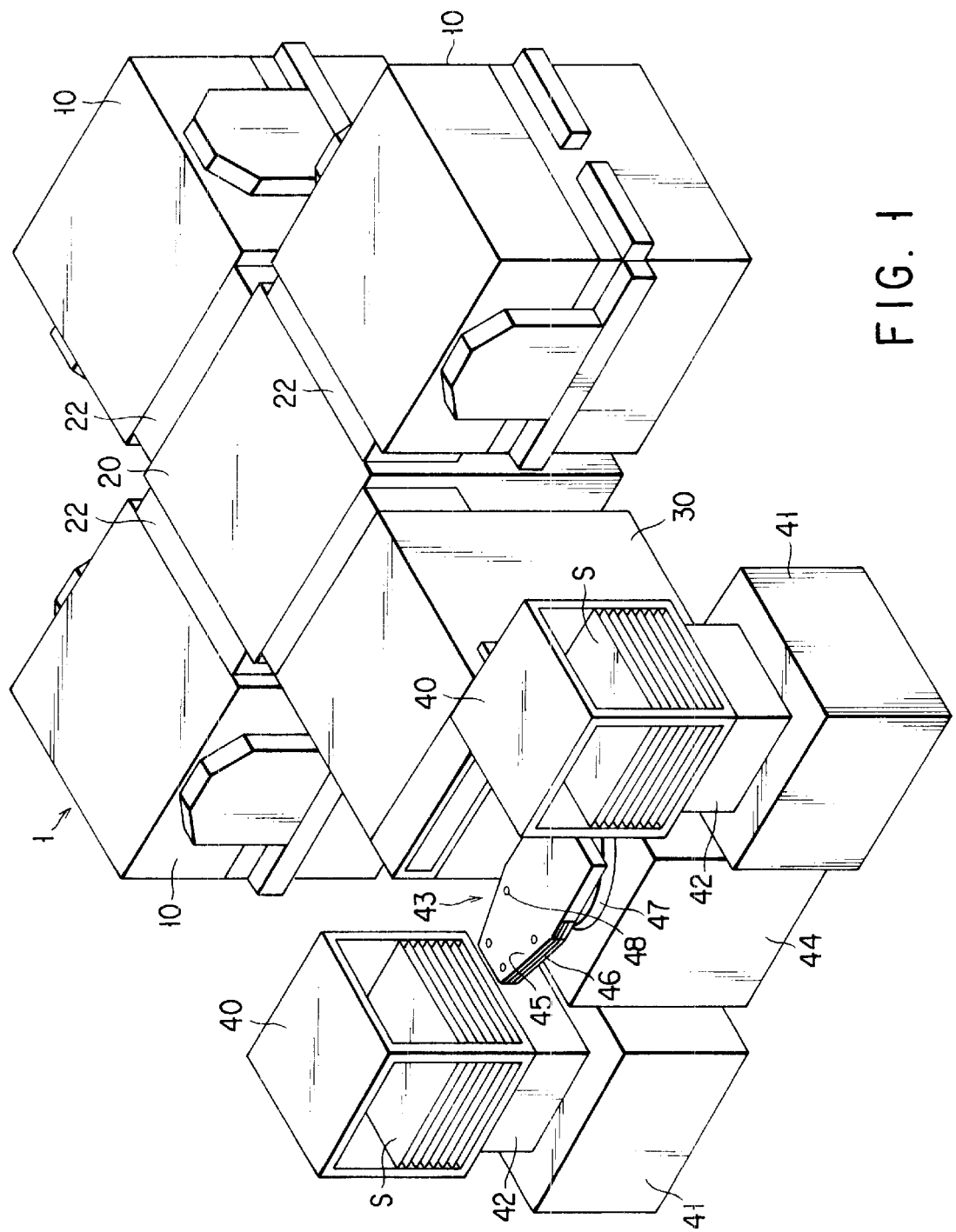
FIG. 1 is a schematic perspective view showing a vacuum processing installation including a vacuum processing apparatus according to an embodiment of the present invention.

Embodiments of the present invention will be described hereinafter with reference to the accompanying drawings. In the following description, the constituent elements having substantially the same function and arrangement are denoted by the same reference numerals, and a repetitive description will be made only when necessary.

Figure 2:
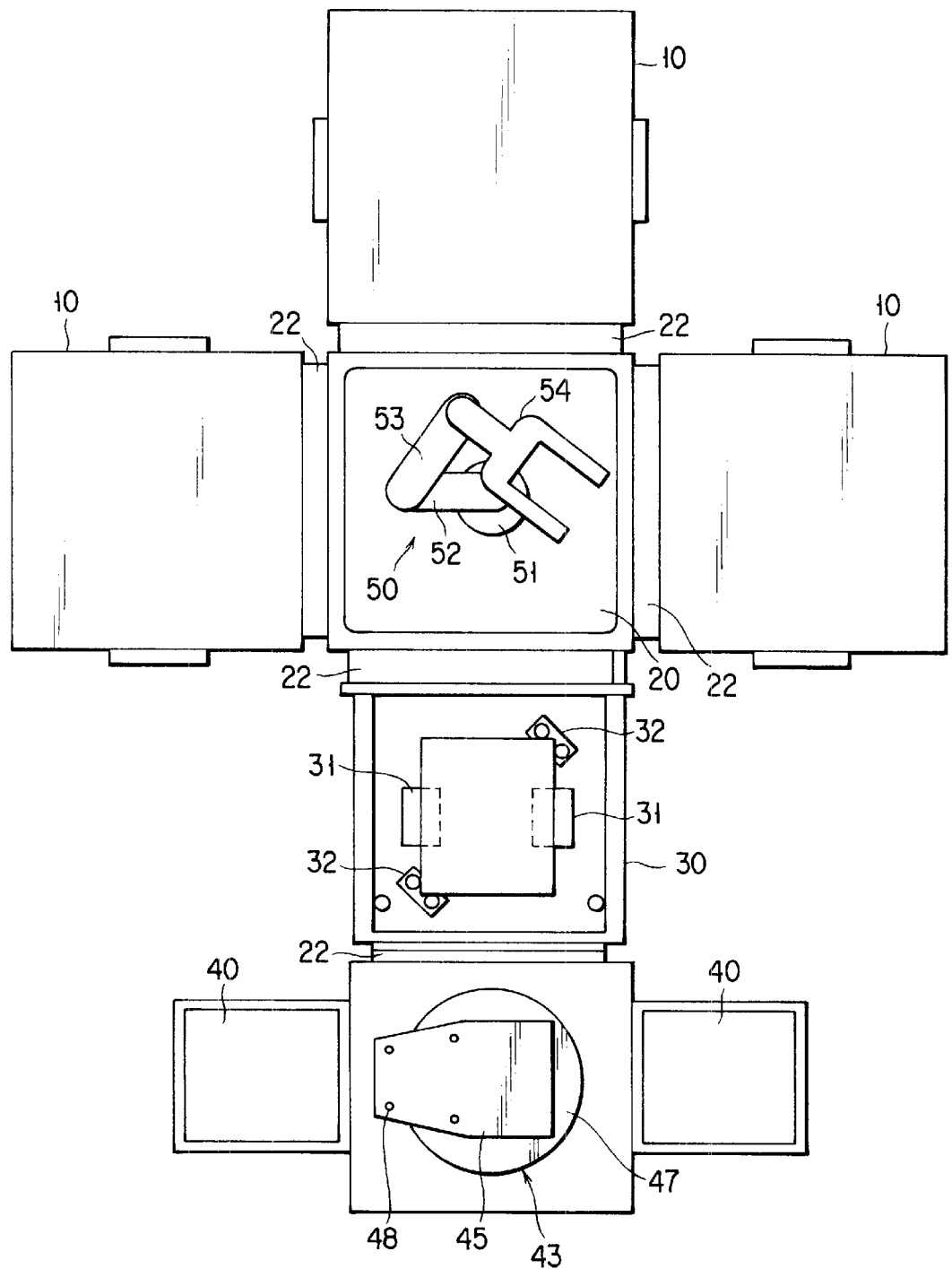
FIG. 2 is a sectional plan view of the vacuum processing installation shown FIG. 1.

FIGS. 1 and 2 are a schematic perspective view and a sectional plan view, respectively, showing a vacuum processing installation including a vacuum processing apparatus according to an embodiment of the present invention. This vacuum processing installation is of a multi-chamber type including a plurality of vacuum processing apparatuses for performing an etching process on glass LCD substrates, i.e., target substrates to be processed.

As shown in FIGS. 1 and 2, the vacuum processing installation 1 includes at the center a transfer chamber 20 and a load-lock chamber 30 connected to each other. Three etching apparatuses 10 are disposed around the transfer chamber 20. Gate valves 22 are respectively disposed at openings between the transfer chamber 20 and the load-lock chamber 30, between the transfer chamber 20 and each of the etching apparatuses 10, and between the load-lock chamber 30 and the ambient atmosphere outside the installation, e.g., generally inside a clean room. The openings are airtightly closed and selectively opened by the respective gate valves 22.

Outside the load-lock chamber 30, there are two cassette indexers 41, on which cassettes 40 storing LCD substrates, i.e., target substrates, are respectively mounted. One of the cassettes 40 stores unprocessed substrates, while the other stores processed substrates. The cassettes 40 are moved up and down by respective elevating mechanisms 42. Note that only one cassette may be used. In this case, processed substrates are transferred back to an empty space in this same cassette.

Between the two cassettes 40, a transfer mechanism 43 is disposed on a table 44 for transferring target substrates. The transfer mechanism 43 includes arms 45 and 46 arranged to form two height levels, and a base 47 supporting the arms 45 and 46 to be integrally movable back and forth and rotatable. Each of the arms 45 and 46 is provided with four projections 48 for supporting a target substrate. The projections 48 are made of an elastic material, such as a synthetic rubber, having a high friction coefficient, so that a supported target substrate is prevented from shifting or falling down.

Each of the etching apparatuses 10 has a vacuum process chamber formed in a process container, as described later. The etching apparatus will be explained in detail later.

The transfer chamber 20 is capable of keeping a certain reduced pressure, as in the vacuum process chambers. A transfer mechanism 50 is disposed in the transfer chamber 20, as shown in FIG. 2. The transfer mechanism 50 is used to transfer target substrates between the load-lock chamber 30 and the three etching apparatuses 10.

The transfer mechanism 50 includes first to third arms 52, 53, and 54 supported by a base 51 and is capable of expanding/contracting. The proximal end of the first arm 52 is rotatably connected to the base 51, the proximal end of the second arm 53 is rotatably connected to the distal end of the first arm 52, and the proximal end of the third arm 54 is rotatably connected to the distal end of the second arm 53. The third arm 54 is formed as a fork like member for supporting a target substrate. The first to third arms 52 to 54 are driven by a driving mechanism built in the base 51, and transfer a target substrate S by the third arm 54. The base 51 is arranged to be movable up and down and rotatable.

The load-lock chamber 30 is also capable of keeping a certain reduced pressure, as in the vacuum process chambers and the transfer chamber 20. In the load-lock chamber 30, a pair of buffer racks 31 are disposed and each have shelves of two height levels, for supporting two target substrates one above the other. Furthermore, in the load-lock chamber 30, a pair of positioners 32 are disposed for positioning the target substrates.

Figure 3:
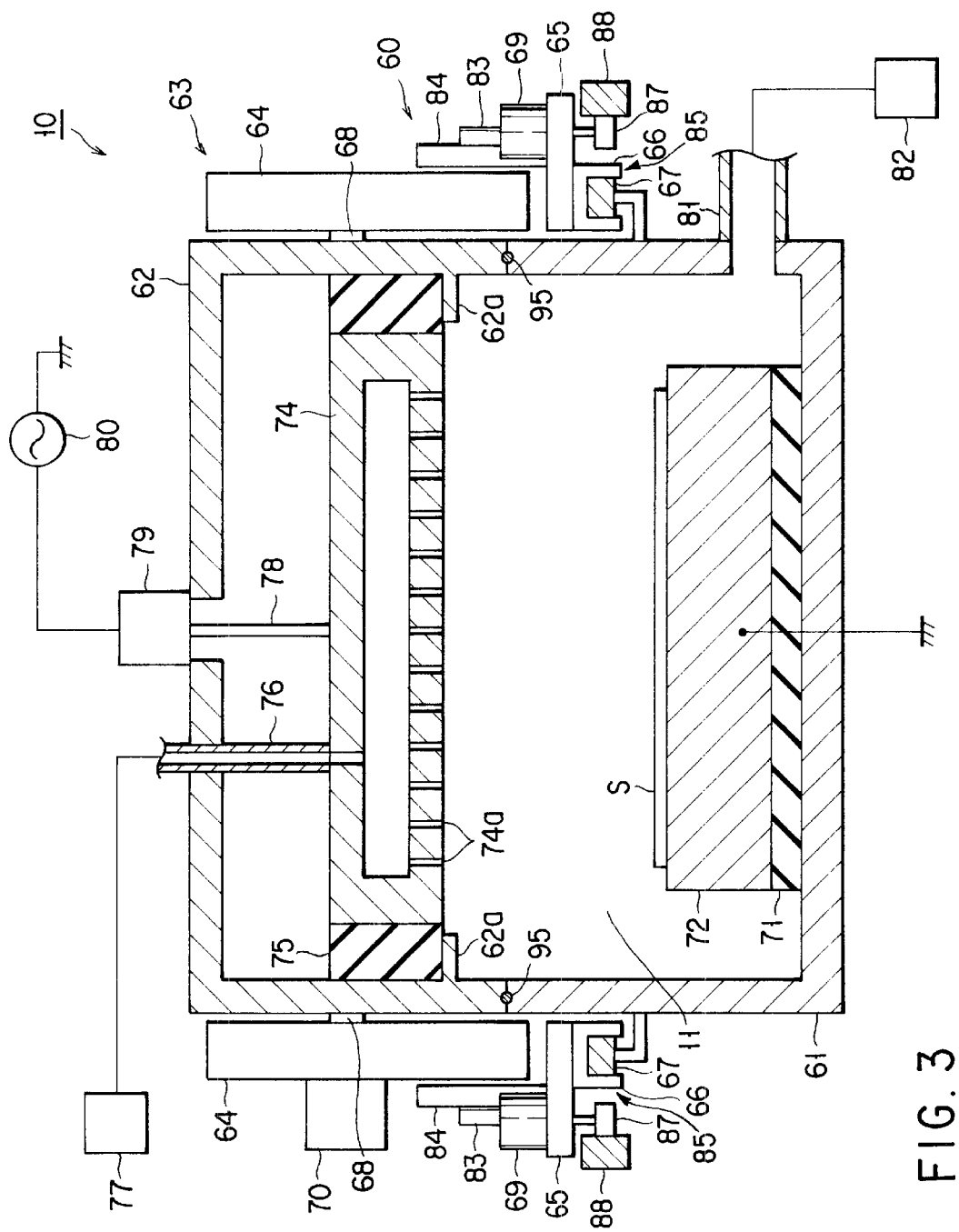
FIG. 3 is a sectional side view of an etching apparatus included in the vacuum processing installation shown FIG. 1.
Figure 4:
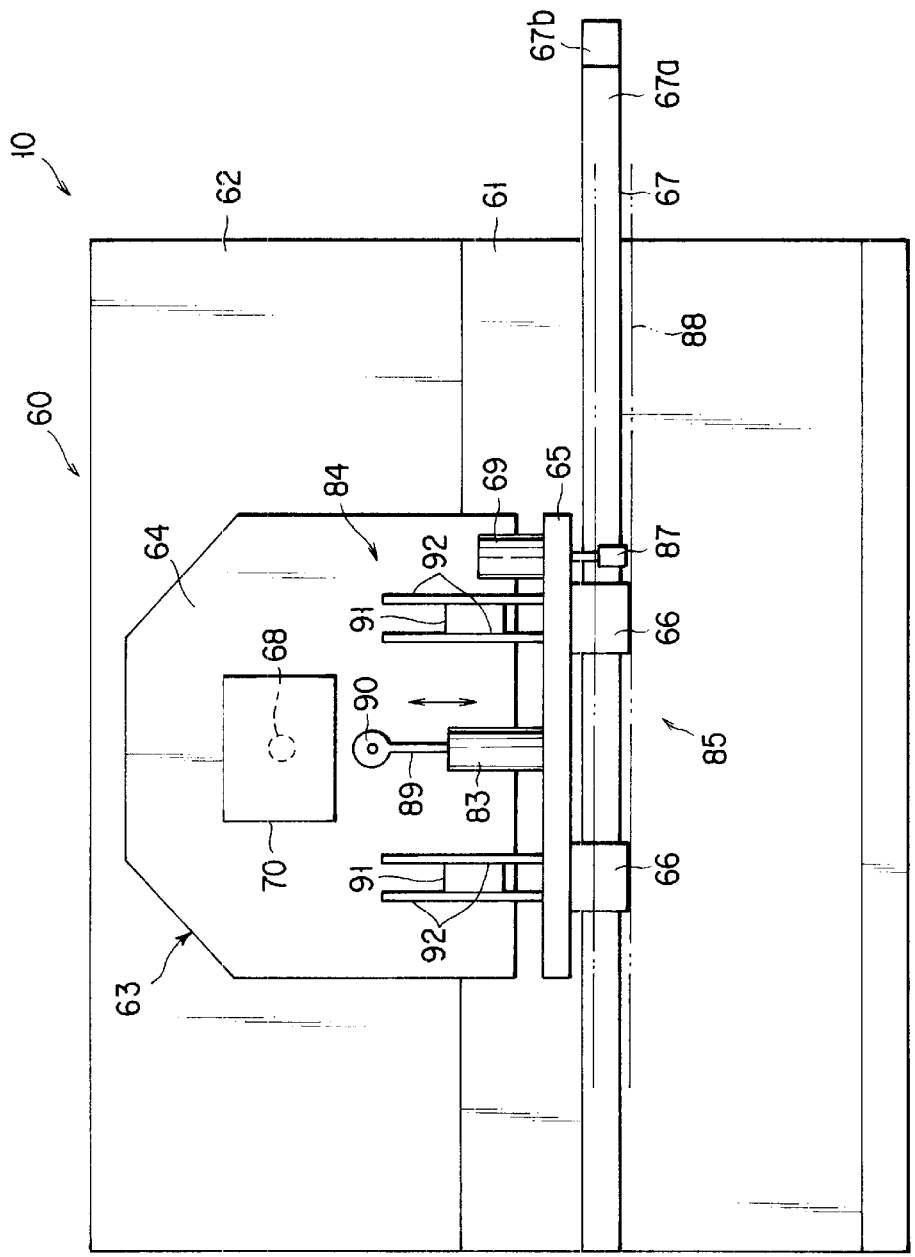
FIG. 4 is a side view of the etching apparatus shown in FIG. 3.
Figure 5:
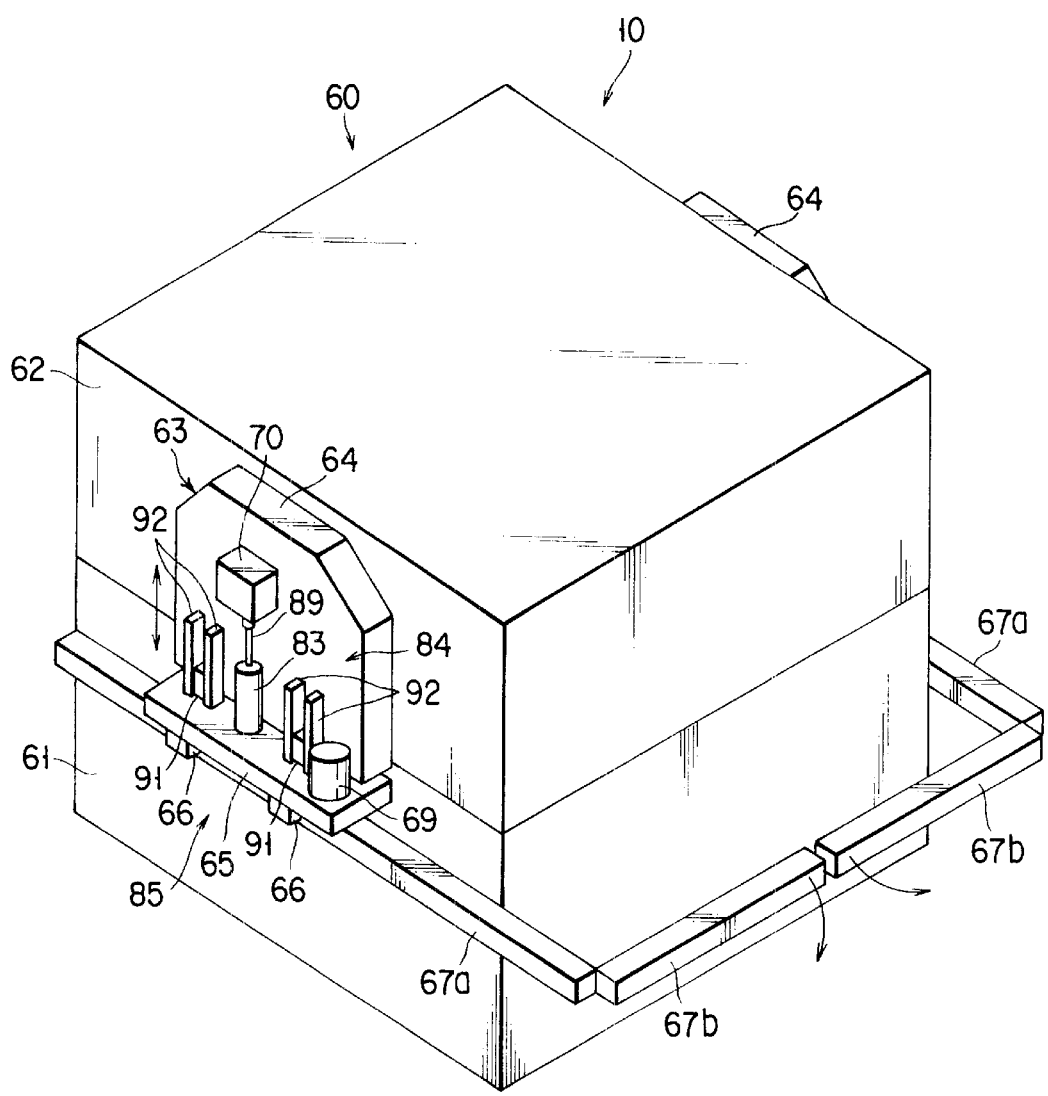
FIG. 5 is a perspective view of the etching apparatus shown in FIG. 3.

FIGS. 3 to 5 are a sectional side view, a side view, and a perspective view, respectively, of an etching apparatus included in the vacuum processing installation shown FIG. 1.

The etching apparatus 10 includes a process container 60 forming an airtight vacuum process chamber 11 for subjecting an LCD substrate S, i.e., a target substrate, to an etching process. The process container 60 is constituted by detachably combining a container main body or lower casing 61 and an upper casing or upper cover 62 with each other, which are joined to each other at a position on a wall forming the process chamber 11. A seal member 95 is interposed between the container main body 61 and the upper casing 62 to ensure that the process chamber 11 is airtight.

A susceptor or worktable 72 is disposed at a lower position inside the process chamber 11, for mounting the LCD substrate (target substrate) S thereon. The susceptor 72 is attached on the bottom of the container main body 61 via an insulating member 71. The susceptor 72 is provided with lifter pins (not shown) in a well-known manner, for assisting transfer of the target substrate S.

The process chamber 11 is connected to an exhaust section 82 through an exhaust line 81, which is connected to a lower position of a sidewall of the container main body 61. The exhaust section 82 includes a vacuum pump, such as a turbo-molecular pump, with which the process chamber 11 is evacuated and set at a vacuum, i.e., a certain reduced pressure atmosphere.

Above the susceptor 72, a showerhead 74, which also works as an upper electrode, is disposed parallel to the susceptor 72. The showerhead 74 is fixed by screws (not shown) to an insulating member 75 disposed around the showerhead 74. The insulating member 75 is supported by a flange 62a inwardly projecting from the upper casing 62 and is fixed thereto by screws (not shown).

The showerhead 74 is connected through a line 76 to a process gas supply section 77 for supplying a process gas for an etching process. The process gas is spouted toward the target substrate S though a number of gas spouting holes 74a formed on the bottom face of the showerhead 74. At the center of the upper side of the showerhead 74, a power supply rod 78 is connected and is provided with a matching box 79 at the top, which is in turn connected to an RF (Radio Frequency) power supply 80.

In an etching process, the process chamber 11 is vacuum exhausted to a certain reduced pressure by the exhaust section 82, and then an RF power is applied to the showerhead 74 from the RF power supply 80 through the matching box 79 and the power supply rod 78. With this operation, plasma of the process gas is produced above the target substrate S, and the plasma etching process is performed on the substrate S.

A detaching device 63 is constructed to move the upper casing 62 between a mounted position where the upper casing 62 is put on the container main body 61, and a retreated position where the upper casing 62 is removed from the container main body 61. The detaching device 63 is arranged to allow the upper casing to be rotated, moved up and down, and moved laterally, relative to the container main body 61. The lateral movement range of the upper casing 62 is set to be large enough such that the upper casing 62 does not interfere with the container main body 61, when it is rotated at the retreated position.

The detaching device 63 includes a pair of standing frames 64 (the pair on the right and left in FIG. 3) for rotatably supporting the upper casing 62. The standing frames 64 are respectively attached to a pair of base frames 65 (the pair on the right and left in FIG. 3) each via a pair of vertical linear guides 84 (the pair on the right and left in FIG. 4). Each of the base frames 65 is mounted on a horizontal linear guide 85 such that it slidably runs thereon in a horizontal direction. In other words, the upper casing 62 is rotatably supported by the pair of standing frames 64 on the right and left, while the standing frames 64 are supported on the horizontal linear guides 85, using the totally four vertical liner guides 84 as legs.

More specifically, rotational axis shafts 68 are respectively connected to the opposite two sidewalls of the upper casing 62 at the center, so that the shafts 68 are positioned on a single horizontal line. The rotational axis shafts 68 are respectively supported by bearings (not shown) arranged in the pair of standing frames 64, which are positioned to sandwich the upper casing 62. On one of the standing frames 64, there is a rotational driver 70 including a rotational motor connected to the corresponding rotational axis shaft 68 via reduction gearing (not shown). The upper casing 62 is rotated by the rotational driver 70 about the rotational axis shafts 68, relative to the standing frames 64.

Each of the vertical linear guides 84, connecting the standing frame 64 and the base frame 65, includes a slide block 91 fixed to the outer side of the standing frame 64, and a guide member 92 fixed to the upper side of the base frame 65 for guiding the slide block 91. An air cylinder 83 used as an elevating driver is disposed on the base frame 65, and the distal end of its piston rod 89 is connected to a beam 90 fixed to the outer side of the standing frame 64. The upper casing 62 is moved up and down along with the two standing frames 64 relative to the base frames 65 by the pair of air cylinders 83 on the right and left while being guided by the four vertical linear guides 84.

Accordingly, the upper casing 62 is moved closer to and away from the container main body 61 in a vertical direction by the air cylinders 83. The upper casing 62 is moved up/down when it is detached/attached relative to the container main body 61. If the upper casing 62 is moved up when it is detached, the upper casing 62 can be easily slid in a lateral direction. In addition, with this operation, the seal member 95 interposed between the container main body 61 and the upper casing 62 is prevented from being damaged.

Each of the horizontal guides 85, supporting the base frame 65, includes a pair of slide blocks 66 (the pair on the right and left in FIG. 4) fixed to the lower side of the base frame 65, and a guide rail 67 for guiding the slide blocks 66. The slide blocks 66 engage with the guide rail 67 such that they straddle the guide rail 67. The two guide rails 67 of the horizontal linear guides 85 are attached to the sidewalls of the container main body 61 and horizontally extend parallel to each other with the container main body 61 sandwiched therebetween.

A driving motor 69 used as a lateral driver is disposed on each of the base frames 65. The distal end of the shaft of the driving motor 69 penetrates the base frame 65 to project vertically downward therefrom, and is provided with a pinion 87. Also, the guide rail 67 is provided with a rack 88 engaging with the pinion 87, on the outer side. When the pinion 87 is rotated by the driving motor 69, the slid blocks 66 run on the guide rail 67 due to the engagement of the gear teeth between the pinion 87 and the rack 88. The upper casing 62 is slid in a lateral direction along with the two standing frames 64 and the two base frames 65 by the pair of driving motors 69 on the right and left while being guided by the two horizontal linear guides 85.

As shown in FIG. 5, each of the guide rails 67 includes a primary portion 67a facing the side of the container main body 61, and a secondary portion 67b horizontally extending beyond the container main body 61. The secondary portion 67b is connected to the primary portion 67a by a hinge (not shown), thus it can be folded toward the side of the container main body 61. When the upper casing 62 is not removed from the container main body 61, the secondary portion 67b stays folded, so that it is prevented from getting in the way.

The total length of the guide rail 67, the sum of the lengths of the primary and secondary portions 67a and 67b, is set to allow the upper casing 62 to be moved in a horizontal direction up to a position, which is the retreated position, where it does not interfere with the container main body 61. Specifically, at the retreated position of the upper casing 62, the upper casing 62 does not interfere with the container main body 61, when it is rotated there as described later. For this purpose, the guide rail 67 of the embodiment has a length that allows the upper casing 62 to be moved by a distance more than the length of the upper casing 62 in its slide direction.

Note that the standing frame 64 is covered with a protection cover (see protection cover 93 shown in FIG. 7) in the actual structure, and thus the above described driving system is hidden. In FIGS. 3 to 5, the protection cover is omitted, for the sake of convenience. Also, in FIG. 5, the rack 88 is omitted for the sake of convenience.

An explanation will be given of an operation of the vacuum processing installation having the structure described above. First, the two arms 45 and 46 of the transfer mechanism 43 are moved back and forth to transfer two target substrates S into the load-lock chamber 30 together from one of the cassettes 40, e.g., the cassette on the left side in FIG. 1, which stores unprocessed target substrates.

The targets substrates S are held by the buffer racks 31 in the load-lock chamber 30, and the gate valve of the load-lock chamber on the atmospheric side is closed after the arms 45 and 46 are retreated. Then, the interior of the load-lock chamber 30 is exhausted and set at a predetermined vacuum pressure. After the vacuum exhaust, the target substrates S are subjected to a positioning operation by the positioners 32.

After the target substrates are aligned, the gate valve 22 between the transfer chamber 20 and the load-lock chamber 30 is opened, and one of the target substrates S is taken out of the load-lock chamber 30 by the third arm 54 of the transfer mechanism 50. This target substrate S is transferred through the transfer chamber 20 into the process chamber 11 of a predetermined etching apparatus 10. By the same operation, the other target substrate S in the load-lock chamber 30 is transferred into the process chamber 11 of another etching apparatus 10.

In each of the etching apparatuses 10, the target substrate S is received by the lifter pins (not shown) of the susceptor 72, and then the third arm 54 is retreated from the process chamber 11, and the gate valve 22 is closed. Since the container main body 61 and the upper casing 62 are combined with each other with the seal member 95 interposed therebetween, it is ensured that the process chamber 11 is airtight.

In the process chamber 11 of the etching apparatus 10, the lifter pins (not shown) are moved down, so that the target substrate S is mounted on the susceptor 72. With this state, the inside pressure of the process chamber 11 is reduced to a predetermined value, and then the etching process gas is supplied from the process gas supply section 77, and is spouted toward the target substrate S through the showerhead 74. At the same time, the RF power is applied to the showerhead 74 from the RF power supply 80 through the matching box 79 and the power supply rod 78. By doing so, plasma of the process gas is produced above the target substrate S, and the plasma etching process is performed on the substrate S.

After the etching process is finished, the gate valve 22 is opened, and the processed target substrate S is transferred by the third arm 54 of the transfer mechanism 50 from the process chamber 10 into the load-lock chamber 30. The two target substrates S processed in the respective etching apparatuses 10 are transferred by the arms 45 and 46 of the transfer mechanism 43 from the load-lock chamber 30 into one of the cassettes 40, e.g., the cassette on the right side in FIG. 1, for storing processed target substrates. In accordance with the above described manner, all the unprocessed target substrates stored in one of the cassettes 40 are subjected to the etching process.

When the whole process described above is repeated a certain number of times, the etching apparatus 10 needs to receive a maintenance operation. In this case, the detaching apparatus 63 is used to move the upper casing 62 from the mounted position where the upper casing 62 is put on the container main body 61, to the retreated position where the upper casing 62 is removed from the container main body 61. This operation sequence will be described with reference to FIGS. 6A to 6E, which show a state where the protection cover is put on the standing frame 64.

Figures 6A, 6B, 6C, 6D, 6E:
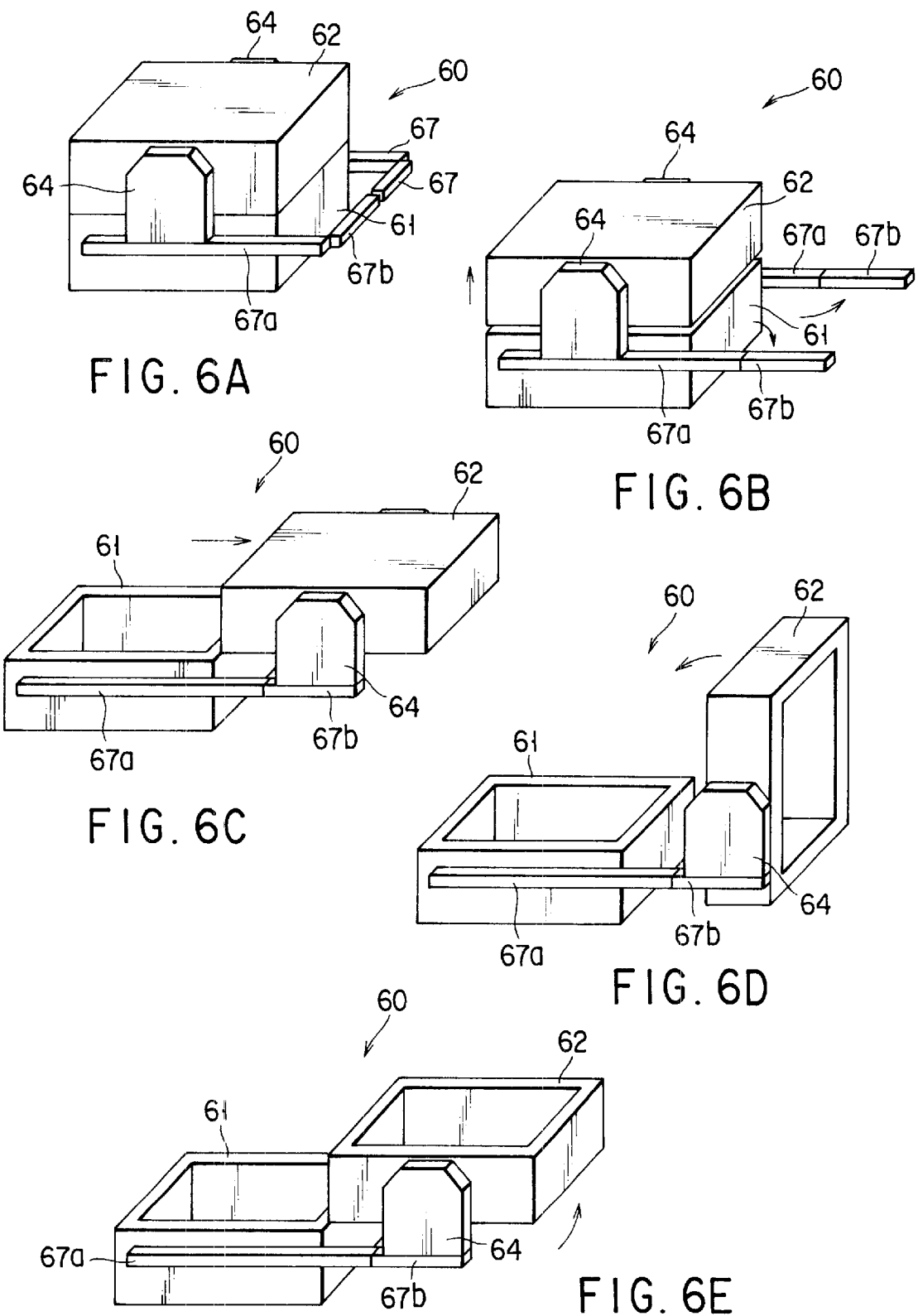
FIGS. 6A, 6B, 6C, 6D, and 6E are perspective views showing an operation of removing an upper casing in the etching apparatus shown in FIG. 3.

First, from the state for processing shown in FIG. 6A, the upper casing 62 is slightly moved up by the air cylinders 83, as shown in FIG. 6B. Also, the folded secondary portions 67b of the guide rails 67 are drawn to extend linearly on the extension lines of the respective primary portions 67a. With this state, the upper casing 62 is slid on the guide rails 67 by the driving motors 69 (see FIGS. 3 to 5), and is moved up to the retreated position at the end of the guide rails 67, as shown in FIG. 6C.

In the state shown in FIG. 6C, since the container main body 61 is completely opened, its interior can be easily subjected to a maintenance operation. Where the upper casing 62 is rotated by 90° from the state shown in FIG. 6C, and is locked in the state shown in FIG. 6D, the interior of the upper casing 62 can be subjected to a simple maintenance operation. Furthermore, where the upper casing 62 is rotated by 180° from the state shown in FIG. 6C, and is locked in the state shown in FIG. 6E, a heavy member, such as the showerhead 74, disposed in the upper casing 62 can be easily removed by, e.g., a hoisting crane. Note that, when the upper casing 62 is moved back to the mounted position on the container main body 61, a sequence reverse to the above described sequence is performed.

As described above, the detaching device 63 for moving the upper casing 62 between the mounted position and the retreated position, i.e., for attaching/detaching it relative to the container main body 61, includes a rotational mechanism (the standing frames 64, the rotational driver 70, and so forth) for rotatably supporting the upper casing 62, an up-and-down movement mechanism (the vertical linear guides 84, the air cylinders 83, and so forth) for supporting the upper casing 62 to be movable up and down, and a lateral movement mechanism (the horizontal linear guides 85, the driving motors 69, and so forth) for supporting the upper casing 62 to be movable in a lateral direction. The retreated position of the upper casing 62 is set such that the upper casing 62 does not interfere with the container main body 61, when it is rotated there.

With this arrangement, the upper casing 62 can be moved up to be detached from the container main body 61, and moved laterally up to the retreated position where the upper casing 62 can be freely rotated. As a result, it is possible to easily perform maintenance operations for the interiors of both the container main body 61 and the upper casing 62, and to easily perform attaching/detaching operations of heavy members in the upper casing 62, if the upper casing 62 is rotated by 180°.

The rotational axis shafts 68 are respectively connected to the opposite two sidewalls of the upper casing 62 at the center. Accordingly, the gravitational center of the upper casing 62 hardly shifts, thereby allowing the upper casing 62 to be easily rotated by 180°.

Each of the guide rails 67 includes the primary portion 67a facing the side of the container main body 61, and the foldable secondary portion 67b horizontally extending beyond the container main body 61. Accordingly, when the upper casing 62 is not removed from the container main body 61, the secondary portion 67b stays folded, so that it is prevented from getting in the way, and the space generally occupied by the vacuum processing installation becomes smaller.

Figure 7:
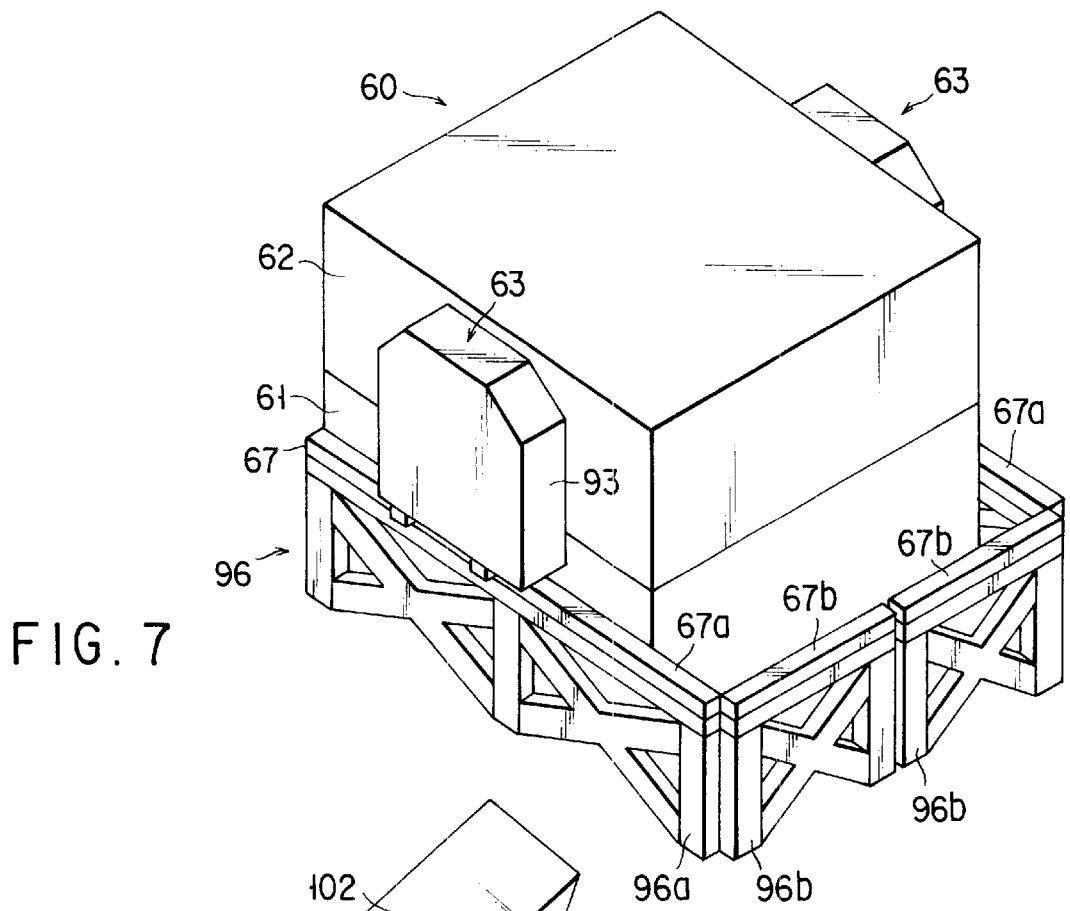
FIG. 7 is a perspective view showing an etching apparatus according to a modified embodiment of the present invention.
Figure 8:
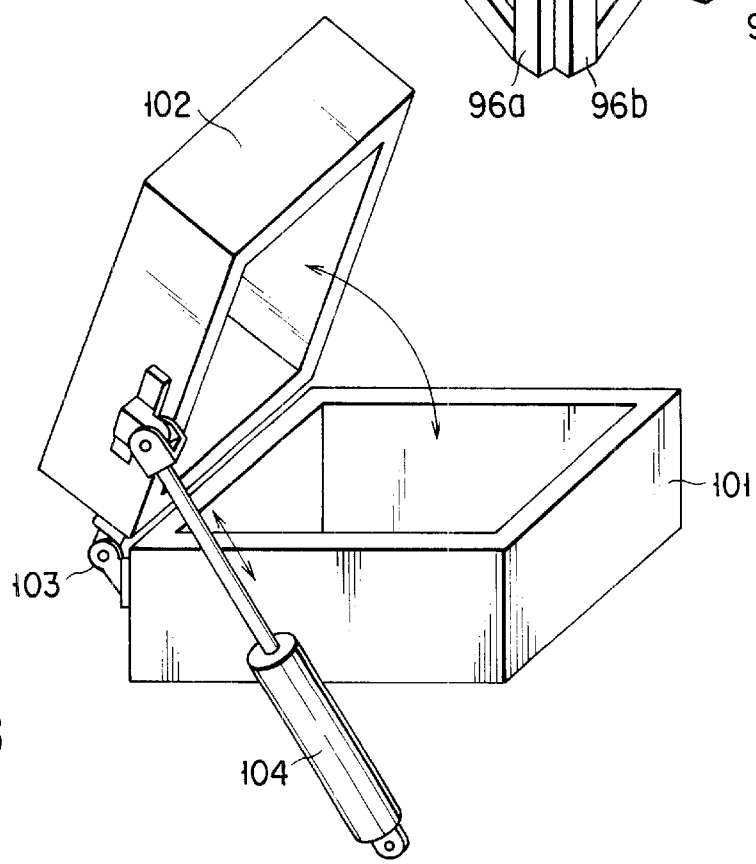
FIG. 8 is a perspective view showing a conventional opening mechanism for a process container.

In the embodiment, a part of each guide rail 67 may be arranged to be retreatable in another manner, such as a sliding manner. On the other hand, a part of the guide rail 67 does not necessarily have to be foldable. Furthermore, as shown in FIG. 7, each guide rail 67 may be attached to a support framework 96, in place of the sidewall of the container main body 61. In this case, a framework portion 96b supporting the secondary portion 67b of the guide rail 67 may be connected to the framework portion 96a supporting the primary portion 67a of the guide rail 67 by a hinge (not shown). Also, the rotational mechanism, the up-and-down movement mechanism, and the lateral movement mechanism for the upper casing 62 are not limited to the mechanisms of the embodiment, but may employ various types of mechanisms.

Although the embodiment is exemplified by a plasma processing apparatus of the parallel plate type, the present invention may be applied to a plasma processing apparatus of the induction-coupling type or the ECR (Electron Cyclotron Resonance) type. Also, although the embodiment is exemplified by an etching apparatus, the present invention may be applied to another plasma processing apparatus, such as a film-forming or ashing apparatus, or to a gas processing apparatus using no plasma. Furthermore, the present invention is not limited to a case where a process chamber is divided into upper and lower casing, and the upper casing is attached/detached, but to a case where, for example, an antenna chamber is attached/detached relative to a process chamber in a plasma processing apparatus of the induction-coupling type. Furthermore, the present invention may be applied to an apparatus for handling a semiconductor wafer as a target substrate, instead of an LCD substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A vacuum processing apparatus for a semiconductor process, comprising:
    a process container forming an airtight process chamber, and comprising a container main body and an upper cover detachably disposed on the container main body;
    a supporting member configured to support a target substrate in the process chamber;
    a gas supply system configured to supply a process gas into the process chamber;
    an exhaust system configured to exhaust the process chamber and set the process chamber at a vacuum; and
    a detaching device configured to attach/detach the upper cover relative to the container main body, the detaching device comprising a rotational mechanism configured to rotatably support the upper cover, an up-and-down movement mechanism configured to support the rotational mechanism and the upper cover to be movable up and down, and a lateral movement mechanism configured to support the up-and-down movement mechanism, the rotational mechanism, and the upper cover to be movable in a lateral direction,
    wherein the lateral movement mechanism comprises a pair of guide rails extending in the lateral direction and disposed parallel to each other with the container main body interposed therebetween, the pair of guide rails being configured to allow the upper cover to be moved up to a retreated position where the upper cover does not interfere with the container main body when the upper cover is rotated by the rotational mechanism, and
    each of the guide rails comprises a primary portion facing a side of the container main body, and a secondary portion extending beyond the container main body in the lateral direction, the secondary portion being foldable toward a side of the container main body.

2. The apparatus according to claim 1, wherein the rotational mechanism comprises a pair of standing frames, which support rotational axis shafts connected to opposite two portions on sidewalls of the upper cover, and are guided by the pair of guide rails.

3. The apparatus according to claim 2, wherein the up-and-down movement mechanism comprises standing guides configured to guide the standing frames up and down, and base frames supporting the standing guides and supported by guide rails.

4. The apparatus according to claim 1, wherein the pair of guide rail are configured to allow the upper cover to be moved by a distance more than a length of the upper cover in the lateral direction.

5. The apparatus according to claim 1, wherein the lateral direction is a horizontal direction.

6. The apparatus according to claim 1, wherein the container main body and the upper cover are joined to each other at a position on a wall forming the process chamber, with a seal member interposed therebetween.

7. The apparatus according to claim 6, wherein the support member comprises a worktable on which the target substrate is mounted in the process chamber, the worktable being attached to the container main body.

8. The apparatus according to claim 6, wherein the gas supply system comprises a showerhead including a plurality of gas spouting holes disposed in the process chamber, the showerhead being attached to the upper cover.

9. A vacuum processing apparatus for a semiconductor process, comprising:
    a process container forming an airtight process chamber, and comprising a lower casing and an upper casing detachably joined to each other at a position on a wall forming the process chamber;
    a seal member interposed between the lower casing and the upper casing;
    a worktable on which the target substrate is mounted in the process chamber, the worktable being attached to the lower casing;
    a gas supply system configured to supply a process gas into the process chamber, and comprising a showerhead including a plurality of gas spouting holes disposed in the process chamber, the showerhead being attached to the upper casing;
    an exhaust system configured to exhaust the process chamber and set the process chamber at a vacuum; and
    a detaching device configured to move the upper casing between a mounted position where the upper casing is put on the lower casing, and a retreated position where the upper casing is removed from the lower casing, the detaching device supporting the upper casing to be rotatable, movable up and down, and movable in a lateral direction, relative to the lower casing, such that the upper casing does not interfere with the lower casing when the upper casing is rotated at the retreated position,
    wherein the detaching device comprises a pair of guide rails configured to guide the upper casing in the lateral direction, the guide rails extending in the lateral direction and disposed parallel to each other with the lower casing interposed therebetween, and
    each of the guide rails comprises a primary portion facing a side of the lower casing, and a secondary portion extending beyond the lower casing in the lateral direction, the secondary portion being foldable toward a side of the lower casing.

10. The apparatus according to claim 9, wherein the detaching device comprises an elevating driver configured to move the upper casing up and down.

11. The apparatus according to claim 10, wherein the detaching device comprises a pair of standing frames, which support rotational axis shafts connected to opposite two portions on sidewalls of the upper casing.

12. The apparatus according to claim 9, wherein the detaching device comprises a rotational driver configured to rotate the upper casing, and a lateral driver configured to move the upper casing in the lateral direction.

13. A vacuum processing apparatus for a semiconductor process, comprising:
   a process container forming an airtight process chamber, and comprising a container main body and an upper cover detachably disposed on the container main body;
   a supporting member configured to support a target substrate in the process chamber,
   a gas supply system configured to supply a process gas into the process chamber, the gas supply system comprising a showerhead including a plurality of gas spouting holes disposed in the process chamber, the showerhead being attached to the upper cover;
   an exhaust system configured to exhaust the process chamber and set the process chamber at a vacuum; and
   a detaching device configured to attach/detach the upper cover relative to the container main body, the detaching device comprising a rotational mechanism configured to rotatably support the upper cover, an up-and-down movement mechanism configured to support the rotational mechanism and the upper cover to be movable up and down, and a lateral movement mechanism configured to support the up-and-down movement mechanism, the rotational mechanism, and the upper cover to be movable in a lateral direction,
   wherein the rotational mechanism comprises a pair of standing frames, which support rotational axis shafts connected to opposite two portions on sidewalls of the upper cover, the rotational axis shafts being respectively disposed at substantial centers of the sidewalls of the upper cover, about which the upper cover rotates,
   the lateral movement mechanism comprises a pair of guide rails configured to guide the standing frames in the lateral direction, the guide rails extending in the lateral direction and disposed parallel to each other with the container main body interposed therebetween, the pair of guide rails being configured to allow the upper cover to be moved up to a retreated position where the upper cover does not interfere with the container main body when the upper cover is rotated by the rotational mechanism, and
   each of the guide rails comprises a primary portion facing a side of the container main body, and a secondary portion extending beyond the container main body in the lateral direction, the secondary portion being foldable toward side of the container main body.

14. The apparatus according to claim 13, wherein the up-and-down movement mechanism comprises standing guides configured to guide the standing frames up and down, and base frames supporting the standing guides and supported by guide rails.

15. The apparatus according to claim 13, wherein the pair of guide rails are configured to allow the upper cover to be moved by a distance more than a length of the upper cover in the lateral direction.

16. The apparatus according to claim 13, wherein the lateral direction is a horizontal direction.

17. The apparatus according to claim 13, wherein the container main body and the upper cover are joined to each other at a position on a wall forming the process chamber, with a seal member interposed therebetween.

18. The apparatus according to claim 17, wherein the support member comprises a workable on which the target substrate is mounted in the process chamber, the worktable being attached to the container main body.

19. The apparatus according to claim 13, wherein the up-and-down movement comprises an elevating driver configured to move the upper cover up and down.

20. The apparatus according to claim 19, wherein the rotational mechanism comprises a rotational driver configured to rotate the upper cover.

21. The apparatus according to claim 20, wherein the lateral movement mechanism comprises a lateral driver configured to move the upper cover in the lateral direction.

* * * * *